(12) United States Patent
Bell et al.

(10) Patent No.: US 6,689,541 B1
(45) Date of Patent: Feb. 10, 2004

(54) PROCESS FOR FORMING A PHOTORESIST MASK

(75) Inventors: Scott A. Bell, San Jose, CA (US); Todd P. Lukanc, San Jose, CA (US); Christopher F. Lyons, Fremont, CA (US); Marina V. Plat, San Jose, CA (US); Ramkumar Subramanian, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 247 days.

(21) Appl. No.: 09/884,182

(22) Filed: Jun. 19, 2001

(51) Int. Cl.[7] .............................. G03C 5/00; G03F 9/00
(52) U.S. Cl. ..................... 430/316; 430/313; 430/314; 430/5; 430/330
(58) Field of Search ........................... 430/5, 312, 313, 430/314, 315, 330, 316

(56) References Cited

U.S. PATENT DOCUMENTS

| | | | | |
|---|---|---|---|---|
| 5,322,764 A | * | 6/1994 | Kamiyama et al. | 430/324 |
| 5,922,503 A | * | 7/1999 | Spak et al. | 430/270.16 |
| 6,255,022 B1 | * | 7/2001 | Young et al. | 430/5 |

* cited by examiner

*Primary Examiner*—Mark F. Huff
*Assistant Examiner*—Saleha R. Mohamedulla
(74) *Attorney, Agent, or Firm*—Foley & Lardner

(57) ABSTRACT

In a process for forming a photoresist mask, a photoresist layer is applied to a substrate. A silyated layer is formed in the photoresist layer. The features of the silyated area correspond to the features of a photoresist mask to be formed. The photoresist layer is then etched to form a photoresist base beneath the silyated area. The photoresist base is etched to remove material from its sides such that it becomes narrower than the silyated area. The silyated area is then removed, leaving a photoresist mask on the substrate.

12 Claims, 5 Drawing Sheets

Selective isotropic etching of the photoresist to remove material from the sides of the photoresist base Application of photoresist Selective exposure of the photoresist Silyation of the exposed photoresist Selective anisotropic etching of photoresist to form an oxide cap and photoresist base Selective isotropic etching of the photoresist to remove material from the sides of the photoresist base Removal of the oxide cap leaving a photoresist mask Etching of the substrate and removal of photoresist mask

PROCESS FOR FORMING A PHOTORESIST MASK

FIELD OF THE INVENTION

The present invention pertains to processes for forming a photoresist mask having dimensions that are less than the dimensions of a pattern projected onto the photoresist to form the mask, and to processes using such a mask.

BACKGROUND OF THE INVENTION

Semiconductor integrated circuits (ICs) are composed of devices such as transistors. While conventional fabrication processes are capable of providing millions of devices in a single IC, there is a need to decrease the size of the device features so that the number of devices in an IC may be further increased.

One limitation on the size reduction of IC device dimensions is the resolution capability of conventional projection lithography. In general, projection lithography is a process by which a pattern is formed during fabrication of an integrated circuit. Such patterns are typically used to form device structures such as doping regions, deposition regions, etching regions, and other structures. Thus the device dimensions are limited by the size of the patterns that can be projected.

In conventional projection lithography, a substrate is coated with a radiation-sensitive photoresist. The photoresist is exposed to radiation that is projected through a reticle containing a pattern to be formed on the substrate. Various types of radiation are conventionally used such as ultra-violet light, vacuum ultra-violet (VUV) light, deep ultra violet light, x-ray radiation, and e-beam radiation. Exposure of the photoresist to the radiation causes the exposed area to become selectively crosslinked and consequently either more or less soluble (depending on the coating) in a particular solvent developer. As a result, the photoresist receives the pattern of radiation that is formed by projection through the reticle. The unwanted areas of the pattern are then removed in a developing process. Conventional projection lithography processes are either "bright field" processes, in which areas to be removed are exposed to radiation, or "dark field" processes, in which areas to be retained are exposed to radiation. A processing step such as etching, diffusion, implantation or deposition is then performed using the photoresist pattern to selectively prevent the effects of the processing step. The remaining photoresist is subsequently removed in a stripping process.

The resolution capability of projection lithography is limited by the wavelength of the radiation used to project a pattern onto the photoresist. Therefore one approach to increasing resolution is to reduce the wavelength of the radiation that is used. Presently, extreme ultraviolet (EUV) lithography enables smaller feature sizes by using short wavelength "long" or "soft" x-rays having wavelengths in the range of 50 to 700 Angstroms. However, the use of shorter wavelengths requires the development of new photoresist chemistries that are responsive to those wavelengths. Therefore the feature sizes achievable through conventional projection lithography systems remain limited. Currently the smallest achievable gate width is approximately 0.18 $\mu$m. Accordingly, there is a need for processes that enable the formation of smaller structures using conventional projection lithography wavelengths and chemistries.

Conventional integrated circuit fabrication techniques may employ a process known as silyation. Generally, silyation involves the introduction of silicon into a photoresist material. Conventional techniques use silyation in combination with projection lithography in a process called a dual multilayer resist process. In this process, a thick layer of photoresist is applied over a non-uniform substrate to provide a planar photoresist surface. A pattern is then projected onto the photoresist, causing exposure of an upper portion of the photoresist layer. This is referred to as top surface imaging (TSI). Depending on the photoresist chemistry, the exposure increases or decreases the permeability of the photoresist to silicon in the exposed area. A silyation process is then performed to selectively introduce silicon into the permeable areas of the photoresist. The photoresist is then exposed to an anisotropic oxygen plasma etch, which converts the silyated photoresist to etch resistant silicon dioxide while simultaneously etching the photoresist that does not lie beneath the silyated photoresist areas. This technique allows the formation of a planar surface through application of a thick layer of photoresist to avoid distortions that would be caused by projection onto a nonplanar layer, without introducing the optical distortions that would result from exposure of the entire thickness of the photoresist.

Various chemistries for silyation of photoresist are known in the art. Silyation agents may be supplied as a gas in a dry silyation method, such as is described in U.S. Pat. No. 5,562,801, or may be supplied as a liquid in a wet chemistry method, such as is described in U.S. Pat. No. 6,063,543, each of which is incorporated herein by reference for these teachings.

While silyation has been used to minimize defects in patterns formed in a photoresist layer by projection lithography, conventional technology has not employed silyation for the purpose of reducing feature sizes in patterns formed in a photoresist layer by projection lithography.

SUMMARY OF THE INVENTION

In accordance with embodiments of the invention, a pattern is projected onto a photoresist to form an area that is then silyated. The photoresist is then etched to remove photoresist that does not underlie the silyated area, and to undercut the photoresist beneath the silyated area so that the features of the photoresist beneath the silyated area are narrower than the corresponding features of the silyated area. Thus the resulting photoresist pattern has narrower features than those that were projected onto the photoresist.

Embodiments of the invention relate to a process for forming a photoresist mask. A photoresist layer is applied to a substrate. A silyated layer is selectively formed in the photoresist layer. The features of the silyated area correspond to the features of a photoresist mask to be formed. The photoresist layer is then selectively etched to form a photoresist base beneath the silyated area. The photoresist base is narrower than the silyated area. The silyated area is then removed, leaving a photoresist mask on the substrate.

Other features and advantages of the present invention will become apparent to those skilled in the art upon review of the following drawings, detailed description, and appended claims.

BRIEF DESCRIPTION OF THE DRAWINGS

An exemplary embodiment will hereafter be described with reference to the accompanying drawings, wherein like numerals denote like elements, and.

DETAILED DESCRIPTION OF PREFERRED EMBODIMENTS

Figure 1:
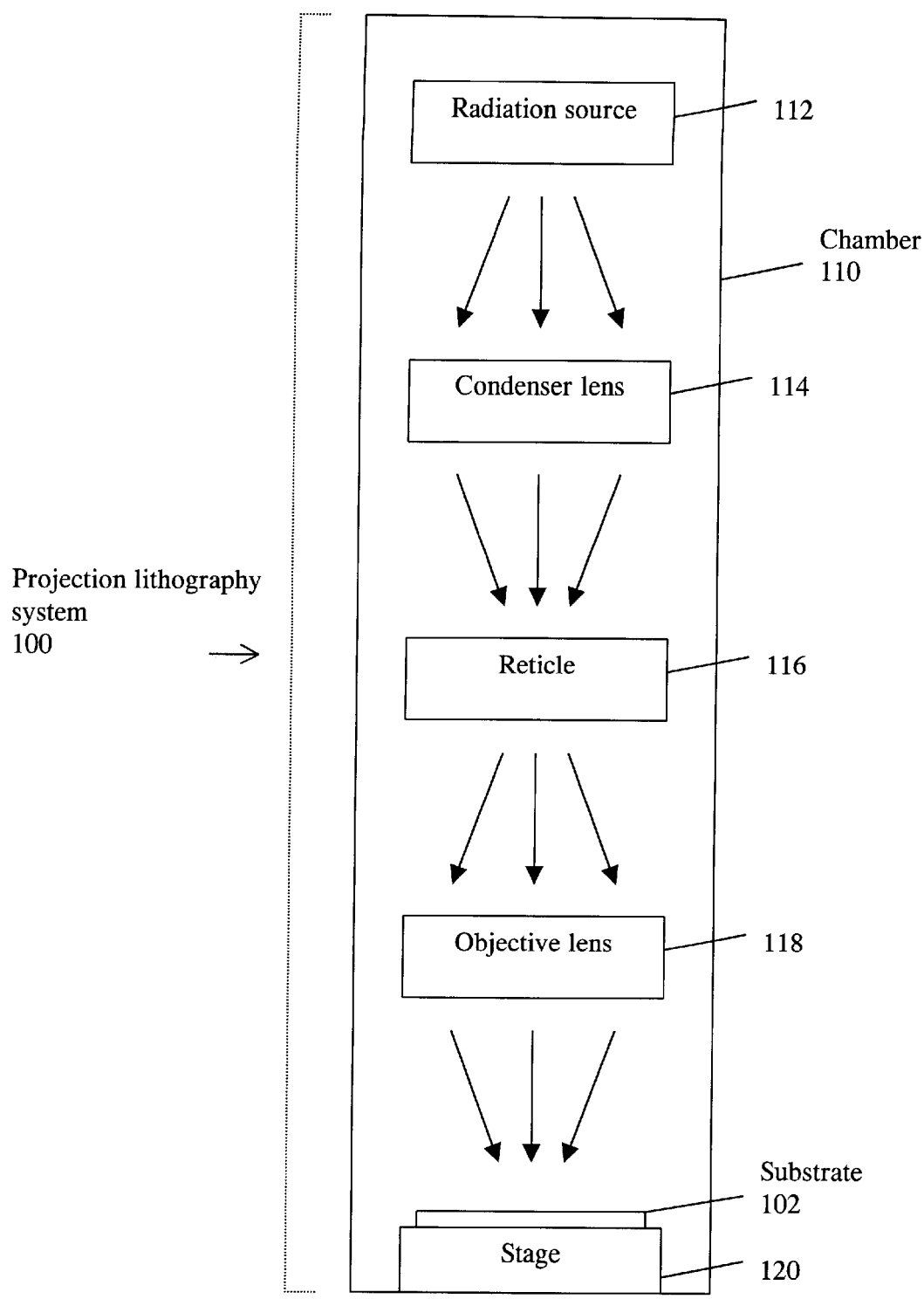
FIG. 1 is a general schematic block diagram of a lithographic system for processing a substrate according to an exemplary embodiment, the substrate can be processed to include contacts through an insulating layer.

FIG. 1 illustrates a conventional projection lithography system 100. The lithography system 100 projects a pattern of radiation onto substrate 102. In accordance with embodiments of the invention, the term substrate is used herein to refer to a structure upon which a photoresist mask is formed, and is not limited to any particular material or structure. The substrate 102 will typically comprise a semiconductor wafer and may also comprise layers of additional materials, devices, and structures.

The projection lithography system 100 includes a chamber 110 and may contain an appropriate lithography or a vacuum in accordance with the type of lithography to be performed. The projection lithography system 100 further includes a radiation source 112, a condenser lens assembly 114, a reticle 116, an objective lens assembly 118, and a stage 120. The stage 120 supports the substrate 102 and may move the substrate 102 with respect to the lens assembly 118. Conventional projection lithography systems may further include mirrors, beam splitters, and other components arranged according to other designs. Projection lithography systems may include a lithographic camera or stepper unit. An example of a conventional projection lithography system is the PAS5500/xxx series machine manufactured by ASML. Other examples include Microscan DUV systems by Silicon Valley Group or an XLS family Microlithography System by Integrated Solutions, Inc. of Korea.

Figure 2:
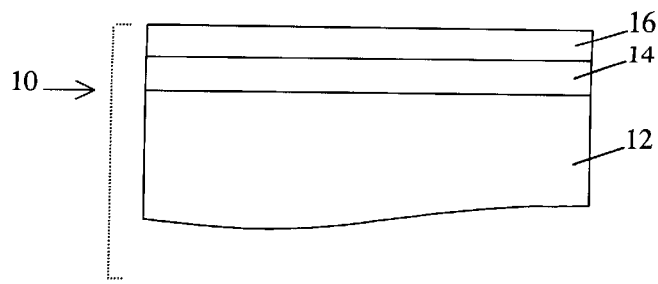
FIG. 2 shows a substrate structure used in a gate fabrication process in accordance with a preferred embodiment of the invention.

FIGS. 2 through 9 illustrate structures formed at successive stages of a process for forming a narrow gate structure of an insulated gate field effect transistor in accordance with a preferred embodiment of the invention. FIG. 2 illustrates a substrate 10 comprised of a conductive gate electrode layer 16, a gate insulator layer 14, and a source and drain diffusion layer 12. A variety of conventional materials are known for each of these layers. For example, the gate electrode layer 16 may be a polysilicon layer, the gate insulator layer 14 may be a silicon oxide layer, and the source and drain diffusion layer 12 may be an intrinsic semiconductor layer or a lightly or heavily doped semiconductor layer. In this process, the gate electrode layer 16 and the gate insulator layer 14 are to be etched using a single photoresist mask to form a self-aligned insulated gate structure overlying a channel region separating source and drain diffusions (not shown). In accordance with conventional processing, the source and drain diffusion regions may be formed prior to or subsequent to the formation of the insulated gate structure and therefore their formation is not addressed here.

Figure 3:
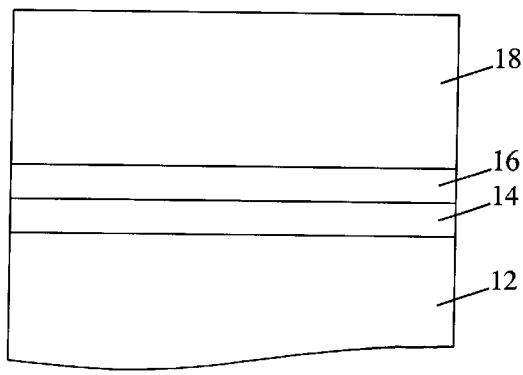
FIG. 3 shows a structure formed by application of photoresist to the structure of FIG. 2 in accordance with a preferred embodiment of the invention.

FIG. 3 shows the structure of FIG. 2 after application of a layer of photoresist 18, which may be performed in any conventional manner.

Figure 4:
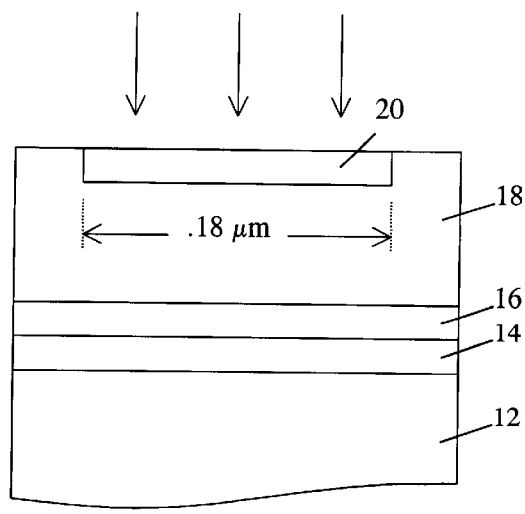
FIG. 4 shows a structure formed by selective exposure to radiation of the structure of FIG. 3 in accordance with a preferred embodiment of the invention.

FIG. 4 shows the structure of FIG. 3 after selective exposure of the photoresist layer 18 to a projected pattern of radiation through a top surface imaging (TSI) process. This exposure forms a shallow silyatable area 20 at the top surface of the photoresist. In this example, the projected pattern and the resulting silyatable area have a width of 0.18 $\mu$m, which is approximately the smallest feature size directly achievable through conventional projection lithography. The features of the pattern correspond to features to be produced in the photoresist mask that will be used to etch the insulated gate structure.

Figure 5:
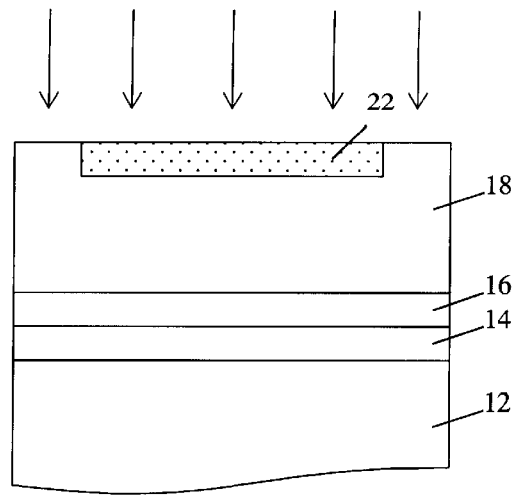
FIG. 5 shows a structure formed by silyation of the structure of FIG. 4 in accordance with a preferred embodiment of the invention.

FIG. 5 shows the structure of FIG. 4 after exposure to a silyation agent has introduced silicon into the silyatable area to form a silyated area 22. The silyation agent may be provided through a wet process or a dry process as described above. The features of the silyated area 22 correspond to features to be produced in the photoresist mask that will be used to etch the insulated gate structure.

It is noted that FIGS. 4 and 5 illustrate a dark field masking process using a negative photoresist, whereby areas of photoresist that are to be silyated are exposed to radiation to enhance their ability to permeability to silicon relative to the remainder of the photoresist layer. However, in other embodiments a bright field process using a positive photoresist may be employed, whereby areas of photoresist that are not to be silyated are exposed to radiation to decrease their permeability to silicon relative to the remainder of the photoresist layer.

Figure 6:
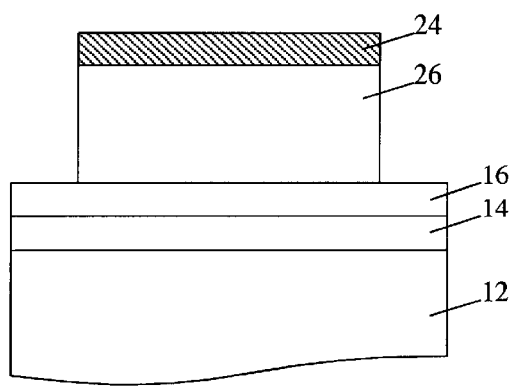
FIG. 6 shows a structure formed by anisotropic etching of the structure of FIG. 5 in accordance with a preferred embodiment of the invention.

FIG. 6 shows the structure of FIG. 5 after selectively etching the photoresist under etching conditions that produce substantially vertical etching, such that etching occurs primarily in the vertical direction with relatively little etching in the horizontal direction. In this example the etchant is an oxygen plasma and etching conditions are controlled to produce substantially anisotropic etching. The oxygen plasma removes photoresist and simultaneously converts the silyated area of the photoresist to silicon oxide. The silyated area serves as an etch mask and etching is conducted for a sufficient amount of time to remove substantially all exposed photoresist. The resulting structure comprises an oxide cap 24 supported by a photoresist base 26.

Figure 7:
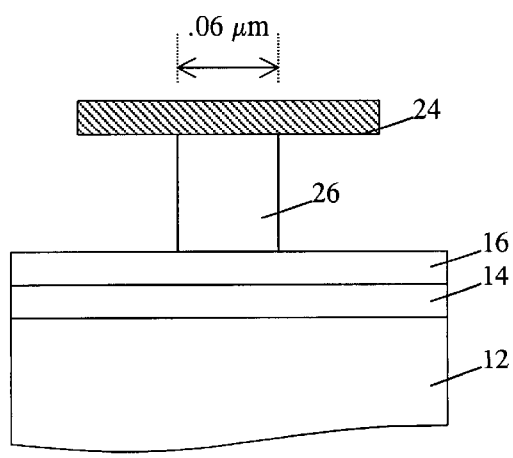
FIG. 7 shows a structure formed by isotropic etching of the structure of FIG. 6 in accordance with a preferred embodiment of the invention.

FIG. 7 shows the structure of FIG. 6 after selectively etching the photoresist under etching conditions that produce substantially isotropic etching of the photoresist, such that photoresist is removed from the sides of the photoresist base 26. In this example the etchant is an oxygen plasma, and etching is conducted for a sufficient amount of time to reduce photoresist base 26 to a desired width. In this example, the photoresist base 26 is etched to a width of 0.06 $\mu$m.

Figure 8:
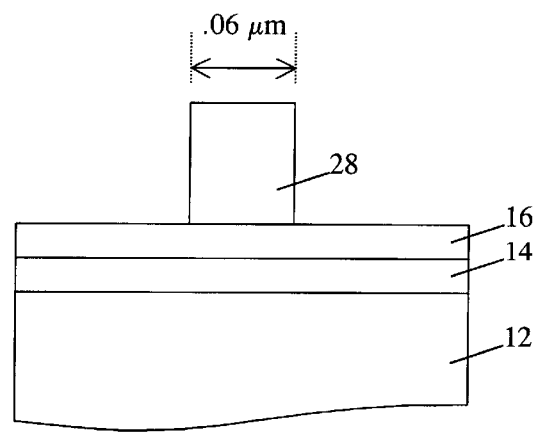
FIG. 8 shows a structure formed by removal of an oxide cap from the structure of FIG. 7 in accordance with a preferred embodiment of the invention.

FIG. 8 shows the structure of FIG. 7 after the oxide cap 24 has been removed from the photoresist base 26. The oxide cap may be removed by further dry etching, such as in a fluorinated environment, or by immersion in a wet etching compound such as hydrofluoric acid. The resulting structure comprises a photoresist mask 28. In this example, the photoresist mask 28 has a width of 0.06 μm, which is smaller than the corresponding pattern that was projected onto the photoresist and is smaller than could be directly produced by conventional projection lithographic processes.

Figure 9:
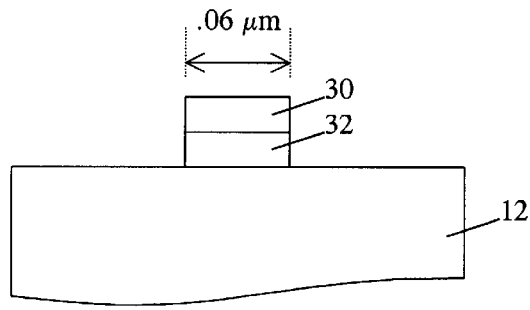
FIG. 9 shows a structure formed by etching the structure of FIG. 8 in accordance with a preferred embodiment of the invention.

FIG. 9 shows the structure of FIG. 8 after the substrate has been etched using the photoresist mask, and the photoresist mask has been stripped from the substrate. The resulting gate structure comprises a gate electrode 30 and a gate insulator 32. In this example, the gate structure has a width of 0.06 μm, which is smaller than could be directly produced by conventional projection lithographic processes.

Those having ordinary skill in the art will recognize a variety of alternatives to the preferred process illustrated in FIGS. 2 through 9. For example, while the preferred embodiments shows the process of forming a gate electrode and insulator, the narrow photoresist masks that are enabled by the present invention may be utilized in a variety of other fabrication processes where photoresist masks are used, such as doping processes, selective deposition processes, and oxidation processes. Alternatively the photoresist mask may be reflowed to produce a reflowed photoresist structure for use in further processing, such as formation of a microlens.

Figure 10:
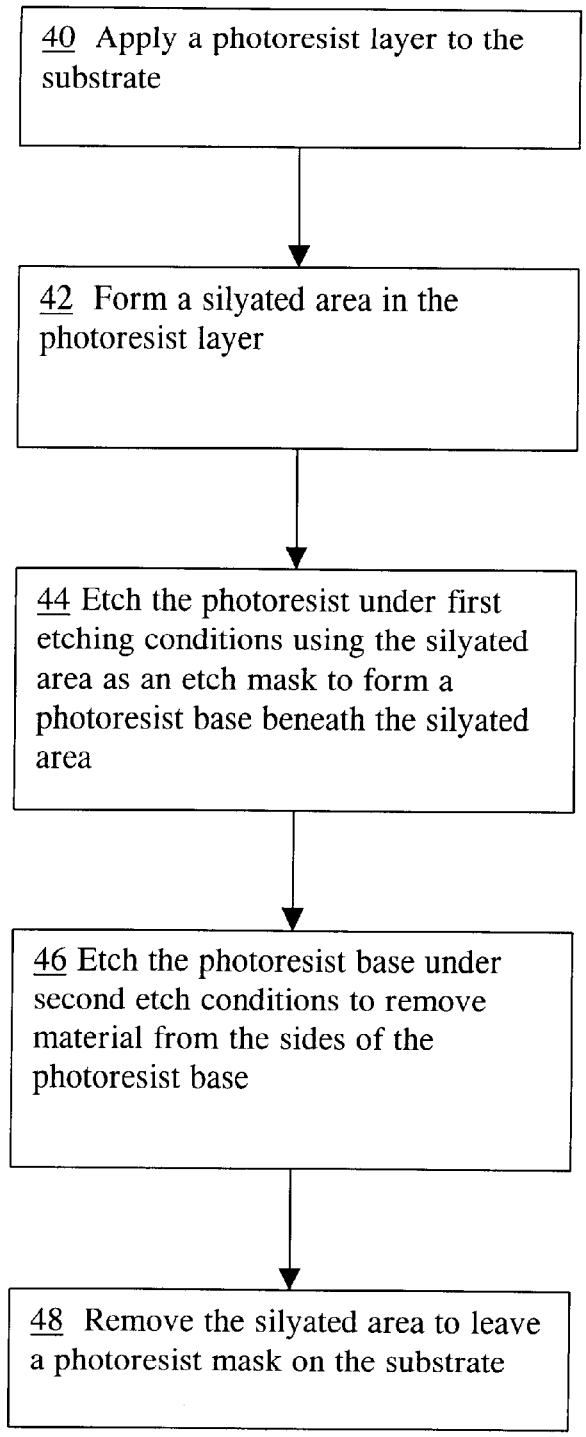
FIG. 10 shows a fabrication process in accordance with embodiments of the invention.

FIG. 10 illustrates a basic process for forming a photoresist mask in accordance with embodiments of the invention. Initially a photoresist layer is applied 40 to a substrate. The substrate may be any material or structure that is to be masked by the photoresist. Subsequently, a silyated area is formed 42 in the photoresist layer. The features of the silyated area correspond to the features of a photoresist mask to be formed. The silyated area may be a single discrete pattern or one of multiple discrete patterns. The silyated area may be formed by selective exposure using either positive or negative photoresist chemistry, and silyation may be performed using wet or dry silyation chemistry.

After selective silyation, the photoresist is etched 44 under first etch conditions using the silyated area as an etch mask to form a photoresist base beneath the silyated area. The etching preferably occurs in a substantially vertical direction. The photoresist base is then etched 46 under second etching conditions to remove material from the sides of the photoresist base. This etch is preferably substantially isotropic and is preferably selective as between the photoresist and the silyated area. The resulting features of the photoresist base thereby become narrower than the corresponding features of the overlying silyated area. The silyated area is then removed 48 to leave a photoresist mask on the substrate. The silyated area may be removed by a wet or a dry process.

While the embodiments illustrated in the figures and described above are presently preferred, it should be understood that these embodiments are offered by way of example only. The invention is not limited to a particular embodiment, but extends to various modifications, combinations, and permutations that nevertheless fall within the scope and spirit of the appended claims.

What is claimed is:

1. A process for forming a photoresist mask, comprising:
   applying a photoresist layer to a substrate;
   forming a silyated area in the photoresist layer;
   etching the photoresist layer under first etching conditions using the silyated area as an etch mask to form a photoresist base beneath the silyated area;
   etching the photoresist base under second etch conditions to remove material from sides of the photoresist base to make the photoresist base narrower than the silyated area; and
   removing the silyated area from the narrower photoresist base to leave a photoresist mask on the substrate.

2. The process claimed in claim 1, wherein said substrate comprises a gate electrode layer and a gate insulating layer, and
   wherein said photoresist mask is formed on said gate electrode layer as a mask for etching said gate electrode layer and said gate insulating layer to form a self aligned insulated gate structure.

3. The process claimed in claim 1, wherein said photoresist layer comprises a positive photoresist, and
   wherein forming said silyated area comprises exposing said photoresist to radiation using a bright field masking process.

4. The process claimed in claim 1, wherein said photoresist layer comprises a negative photoresist, and
   wherein forming said silyated area comprises exposing said photoresist to radiation using a dark field masking process.

5. The process claimed in claim 1, wherein forming said silyated area comprises exposing said photoresist to a wet silyating agent.

6. The process claimed in claim 1, wherein forming said silyated area comprises exposing said photoresist to a dry silyating agent.

7. The process claimed in claim 1, wherein said first etching conditions produce substantially anisotropic etching in a substantially vertical direction.

8. The process claimed in claim 1, where said second etching conditions product substantially isotropic etching.

9. The process claimed in claim 1, further comprising implanting a material into said substrate using said photoresist mask as an implantation mask.

10. The process claimed in claim 1, further comprising etching the substrate using said photoresist mask as an etch mask.

11. The process claimed in claim 1, further comprising:
    depositing a material over said substrate and said photoresist mask; and
    removing said photoresist mask.

12. The process claimed in claim 1, further comprising reflowing said photoresist mask.

* * * * *